(12) United States Patent
Moore

(10) Patent No.: US 9,854,700 B2
(45) Date of Patent: Dec. 26, 2017

(54) OPTIMIZED DISASTER RESISTANT HOUSING FOR AN ARRAY OF COMPUTER DATA STORAGE DEVICES AND METHOD OF MANUFACTURING

(71) Applicant: Robby Jay Moore, Auburn, CA (US)

(72) Inventor: Robby Jay Moore, Auburn, CA (US)

(73) Assignee: ioSafe, Inc., Auburn, CA (US)

(*) Notice: Subject to any disclaimer, the term of this patent is extended or adjusted under 35 U.S.C. 154(b) by 28 days.

(21) Appl. No.: 14/999,364

(22) Filed: Apr. 27, 2016

(65) Prior Publication Data

US 2016/0330861 A1 Nov. 10, 2016

Related U.S. Application Data

(60) Provisional application No. 62/179,442, filed on May 6, 2015.

(51) Int. Cl.
*G06F 1/18* (2006.01)
*H05K 7/14* (2006.01)
*G11B 33/14* (2006.01)
*G11B 33/02* (2006.01)

(52) U.S. Cl.
CPC ........... *H05K 7/1495* (2013.01); *G06F 1/181* (2013.01); *G11B 33/022* (2013.01); *G11B 33/142* (2013.01); *G11B 33/1406* (2013.01); *G11B 33/1426* (2013.01); *G11B 33/1446* (2013.01)

(58) Field of Classification Search
CPC . G06F 1/181; G06F 1/182; G06F 1/20; G06F 1/206; H05K 7/1495; G11B 33/142; G11B 33/1426
See application file for complete search history.

(56) References Cited

U.S. PATENT DOCUMENTS

| | | | | |
|---|---|---|---|---|
| 8,605,414 B2* | 12/2013 | Moore | ................... | G06F 1/182 361/679.02 |
| 2005/0286225 A1* | 12/2005 | Moore | ................... | G06F 1/182 361/695 |
| 2007/0017685 A1* | 1/2007 | Moore | ................. | H05K 5/0213 174/17 VA |
| 2008/0049388 A1* | 2/2008 | Shogan | .................... | G06F 1/20 361/676 |
| 2008/0175983 A1* | 7/2008 | Moore | ............... | G11B 33/1453 427/96.6 |
| 2009/0050365 A1* | 2/2009 | Moore | ................. | G11B 33/142 174/547 |
| 2009/0219679 A1* | 9/2009 | Moore | ...................... | G06F 1/20 361/679.31 |
| 2011/0058330 A1* | 3/2011 | Abraham | .................. | G06F 1/20 361/679.47 |

(Continued)

*Primary Examiner* — Adrian S Wilson
(74) *Attorney, Agent, or Firm* — Bruce H Johnsonbaugh

(57) ABSTRACT

A thermally and structurally optimized disaster resistant housing for a vertically stacked array of computer digital data storage devices such as hard drives is provided. An external, fire resistant housing has an internally mounted water resistant enclosure for the array. The water resistant enclosure includes a plurality of much thicker plates than known which significantly increase dissipation of heat and simultaneously greater increase the crush and impact load resistance of the device. An automatic method is also provided for producing complex molded gypsum or cement components.

4 Claims, 6 Drawing Sheets

(56) References Cited

U.S. PATENT DOCUMENTS

2012/0087085 A1* 4/2012 Moore .................... G06F 1/182
                                                    361/679.46
2012/0106070 A1* 5/2012 Landon ................... G06F 1/183
                                                    361/679.47

* cited by examiner

OPTIMIZED DISASTER RESISTANT HOUSING FOR AN ARRAY OF COMPUTER DATA STORAGE DEVICES AND METHOD OF MANUFACTURING

CROSS REFERENCE TO RELATED APPLICATION

This application claims the benefit of and priority from U.S. provisional application Ser. No. 62/179,442 filed May 6, 2015.

BACKGROUND

As worldwide digital data continues to expand rapidly, it is estimated that well over half of that data remains vulnerable to destruction by a variety of natural and man-made causes. Such causes include (without limitation) fires, floods, earthquakes, hurricanes, tornadoes, water damage from sprinkler systems actuated by fire, war and terrorism A large portion of the data is stored on vertically stacked multi-drive arrays having a number of computer hard drives or other devices for storing and retrieving computerized digital data. In the following description, the example of hard drives is utilized as one example of various data storage devices usable with the system disclosed. As larger, vertically stacked arrays are utilized, disaster resistant housings become taller. Cooling the multitude of hard drives in taller housings becomes a major challenge.

Providing adequate impact and crush resistance, together with water resistance, for larger housings also becomes a greater challenge. As disaster resistant housings become taller, their resistance to side impact and crush loads diminishes, assuming the thickness of the exterior walls remains unchanged.

As the demand for disaster resistant data housings increases, so does the demand for cost effective manufacturing techniques.

There is a definite and rising need for a cost effective disaster resistant housing capable of protecting arrays of hard drives from disasters such as mentioned above. More particularly, there is a pressing need for such a housing in which effective cooling of multiple hard drives stacked vertically in close proximity is achieved; and a corresponding need for such a relatively tall housing to have adequate side impact and crush resistance.

A significant problem is that as gypsum-walled housings become taller, the housing's resistance to side impact and crush forces is reduced exponentially if the wall thickness remains constant.

The present invention provides an elegant solution to these intertwined problems.

BRIEF SUMMARY OF THE INVENTION

The solution provided by the present invention to the above problems is a significantly improved water resistant, extruded enclosure for an array of hard drives, wherein the enclosure is mounted internally of an outer, fire resistant housing. The improved enclosure provides multiple functions, namely:

First, the improved, water resistant inner enclosure provides increased cooling by inclusion of significantly thicker, thermally conductive, horizontal plates that support each of the hard drives. Whereas the prior art included relatively thin, conductive sheets for simply supporting the hard drives, those sheets occupied only about 10-20% of the air gap or vertical space between adjacent hard drives. The improved plates described herein occupy more than 75% of the vertical space between hard drives and are more than three times as thick as prior art sheets on which hard drives are placed. The advantage of this feature is that the improved plates, typically extruded aluminum (or other metal), provide significantly better cooling by conduction through the aluminum (or other metal) rather than through air. The thermal conductivity of aluminum is roughly 800 times greater than that of air. It is believed that the heat transfer through the water resistant enclosure is increased by at least 200%. In a significant number of applications, this increased transfer of heat allows the elimination of forced air ventilation, which in turn helps reduce costs or manufacture.

Second, the much thicker, horizontal plates between hard drives greatly increase the resistance to side impact and crush loads of the water resistant enclosure. It is believed that the side impact and crush resistance is increased about tenfold and the vertical impact and crush resistance is increased about five times.

Third, the present invention provides an improved manufacturing system for critical gypsum components, which utilizes automated equipment for making complex three dimensional components.

A primary object of the invention is to provide a simultaneously thermally and structurally optimized disaster resistant housing for an array of vertically stacked hard drives or other operable digital data storage devices.

A further object is to provide a cost effective disaster resistant housing for an array of vertically stacked hard drives or other digital data storage devices.

Other objects and advantages of the invention will become apparent from the following description and drawings.

BRIEF DESCRIPTION OF THE DRAWINGS

FIG. 4A illustrates the device before a disaster such as fire. FIG. 4B shows the device after the disaster.

DETAILED DESCRIPTION OF THE DRAWINGS

Figure 1:
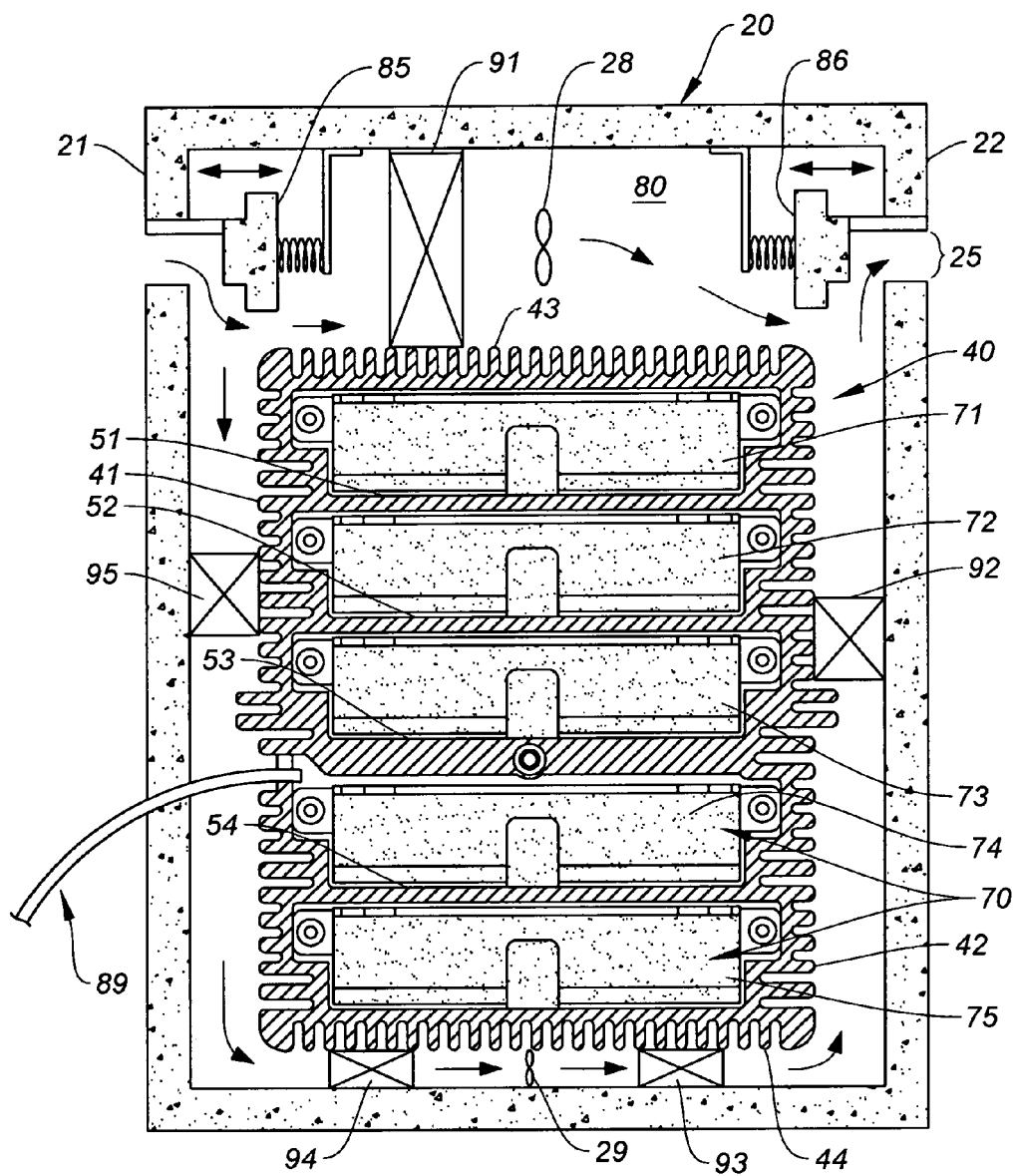
FIG. 1 illustrates one embodiment of the invention.

FIG. 1 is a schematic, sectional view of one embodiment of the invention. A disaster resistant device shown generally as 10 includes a fire resistant external housing 20 made of gypsum or cement such as Portland cement and a thermally conductive, water resistant enclosure 40 carried inside housing 20. A vertically stacked array 70 of digital data storage devices 71-75 is mounted inside enclosure 40.

Water resistant enclosure 40 is preferably made of extruded metal such as aluminum, or other extrudable material with high thermal conductivity. Side walls 41 and 42 are finned as known in the art for maximum dissipation of heat generated by operational hard drives 71-75. The top 43 and bottom 44 of enclosure 40 are also finned for maximum dissipation of heat from hard drives 71-75. The front and rear walls of enclosure 40 (not visible in FIG. 1) are preferably flat, finned aluminum or other metal members removably connected to side walls 41-42, top 43 and bottom 44 with waterproof seals as known in the art.

A plurality of plates 51-54 extend between side walls 41 and 42 of extruded enclosure 40 to form a plurality of separate cavities in which individual computer digital data storage devices (such as hard drives 71-75) are carried. Hard drives 71-75 form one embodiment of a vertically stacked array of operable computer digital data storage devices.

Figure 2:
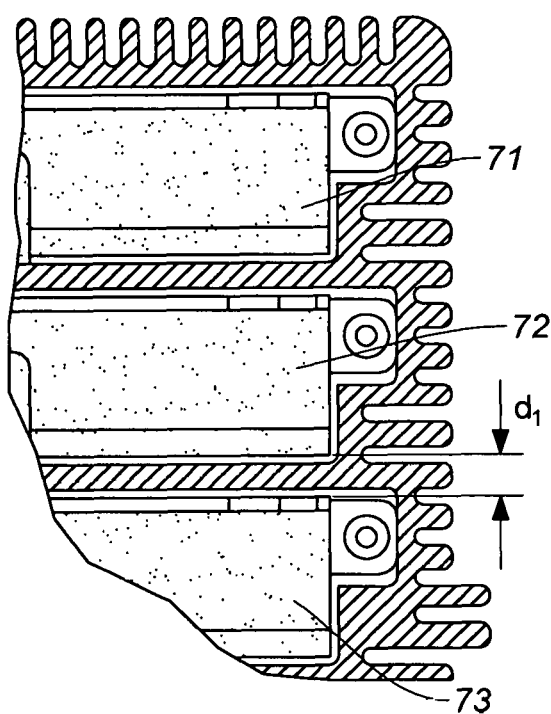
FIG. 2 is an expanded view of a portion of the device shown in FIG. 1.

FIG. 2 is an expanded view of a segment of the device shown in FIG. 1. As shown in FIG. 2, vertically adjacent hard drives are spaced apart by vertical spaces or gaps shown best as $d_1$ between hard drives 72 and 73. A significant aspect of the present invention is that the plates 51-54 are sufficiently thick to occupy at least 75% of said vertical spaces or distances 81-84 (shown best in FIG. 2) between vertically adjacent hard drives.

As noted above, by making the plates 51-54 of FIG. 1 of such great thickness, the increase of heat conduction from hard drives 71-75 is dramatic, and believed to be over 200%, since aluminum has a thermal conductivity about 800 times greater than that of air.

Figure 3:
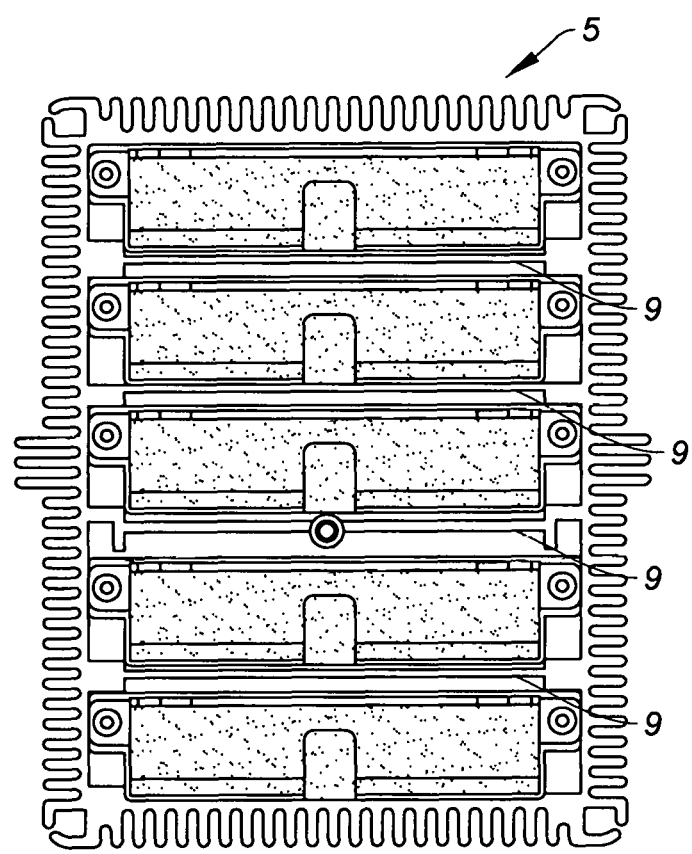
FIG. 3 is an example of the prior art.

As shown in FIG. 3, the prior art uses relatively thin sheets of material 9 in water resistant enclosure 5 to support the hard drives wherein the sheets 9 occupied only about 10-20% of the vertical gap between hard drives. The present invention increases the thickness of the plates 51-54 more than three times the thickness of prior art sheets for supporting the hard drives.

As shown in FIG. 1, the heat from hard drives 71-75 is transferred by conduction through the extruded aluminum (or other conductive alloy) to the finned exterior of enclosure 40. The heat is then transferred to the air space 80 between enclosure 40 and the walls of exterior housing 20. Ventilation fans 28 and 29 force the heated air through passageway 25 formed in wall 22 of housing 20 to ambient air. The fire resistant external housing 20 is fabricated preferably of gypsum as known in the art. The external housing can be of any design shown in U.S. Pat. Nos. 7,843,689, 7,880,097 and 8,605,414 (incorporated herein by reference) which is capable of exhausting heat from an array of hard drives to ambient atmosphere. The detailed design of various ventilation techniques for exhausting heat is described in the three patents described and is not repeated here for the sake of brevity. Movable hatches 85 and 86 close in the presence of fire, as is known in the art.

It is significant to note that in a significant number of applications, the increased thermal transfer and dissipation provided by the present invention allows the elimination of fans to exhaust heat to ambient atmosphere. This feature contributes to the cost effectiveness of the design.

A further, significant advantage of the thick plates 51-54 is that the impact and crush load resistance of water resistant enclosure 40 is greatly increased. This feature is critical to any disaster resistant enclosure in which data is stored. It is believed that side impact and crush resistance is increased tenfold and vertical impact and crush resistance is increased five-fold over the prior art.

The impact and crush resistance of external housing 20 may be increased by the use of optional braces 91-95 mounted between the outer surface of water resistant enclosure 40 and the inner surface of the exterior housing 20. The braces are preferably formed of a kinetic energy absorbing, fire resistant material such as metallic honeycombs or foam, for example. Braces 91-95 may optionally be made of gypsum or Portland cement. The braces are designed to allow air flow through or past them for ventilation.

Power line 89 extends through openings formed in housing 20 and wall 41 as known in the art.

Figure 4A:
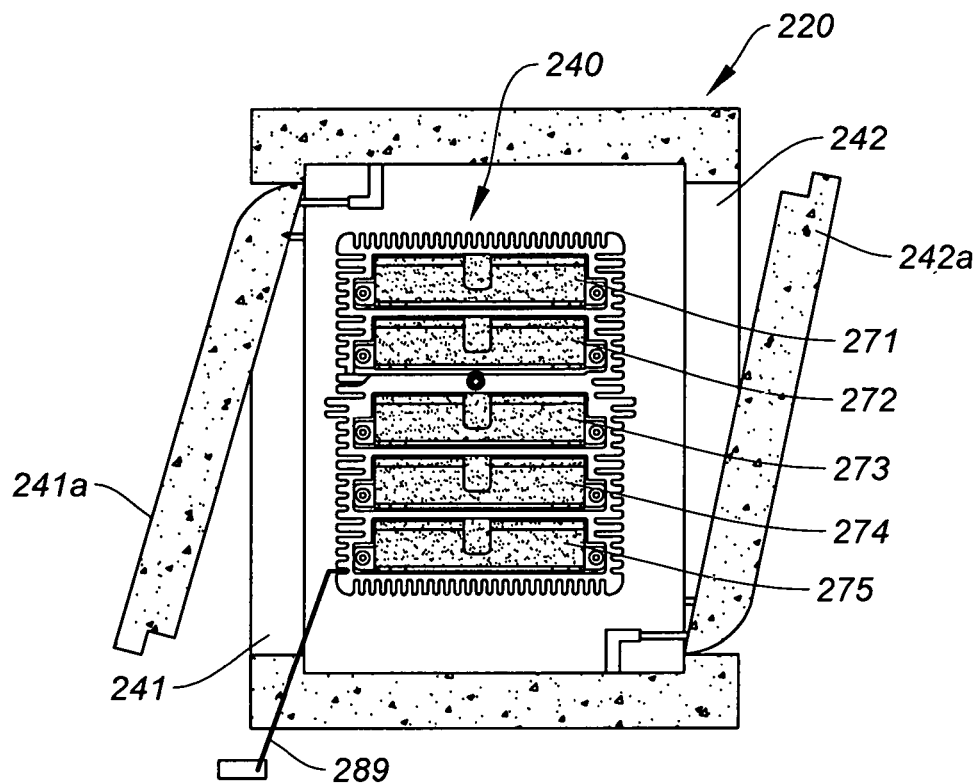
FIGS. 4A and 4B illustrates a second embodiment of the invention.
Figure 4B:
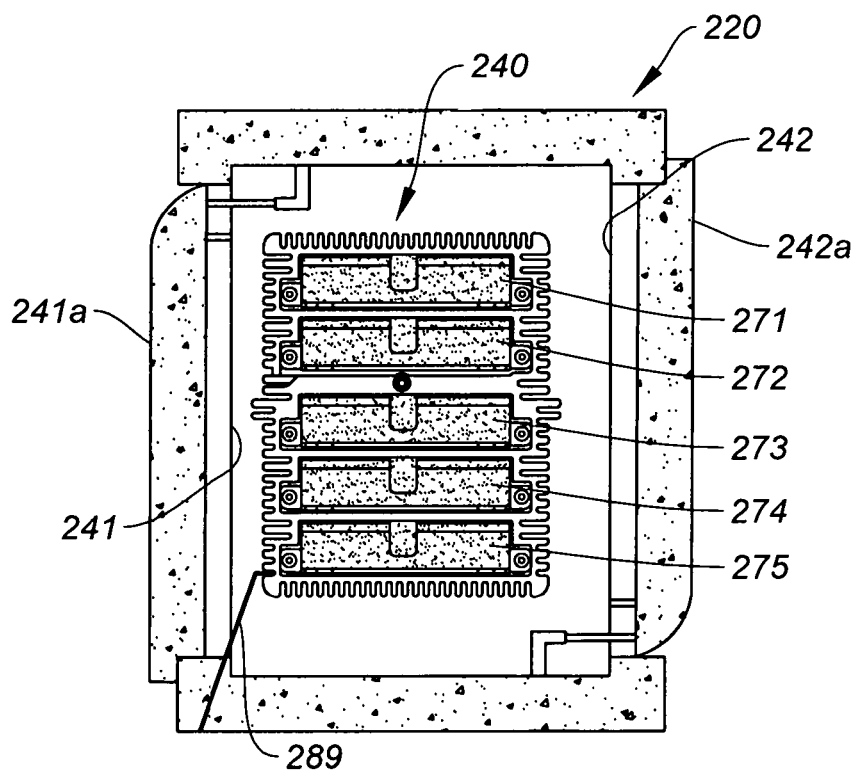

FIGS. 4A and 4B illustrates an alternate embodiment of the invention. This embodiment utilizes an exterior housing 220 similar to that shown in FIGS. 35 and 36 of U.S. Pat. No. 7,880,097. Disaster resistant housing 220 carries enclosure 240. Housing 220 has movable, pivoting hatches 241*a* and 242*a* in side walls 241 and 242. FIG. 4A shows the device with hard drives 271-275 during normal operation. Hatches 241*a* and 242*a* are in their open position to allow ventilation of the heat from hard drives 271-275. In the presence of fire, hatches 241*a* and 242*a* close, as shown in FIG. 4B. This embodiment is capable of operating in the open position of FIG. 4A without the use of forced air fans to exhaust heat to ambient atmosphere. Power line 289 becomes severed in a fire.

FIG. 5A-5D are "concept" sketches of the improved, automatic method of making complex, three dimensional gypsum or Portland cement components for use interiorly of the exterior housings.

Figure 5A:
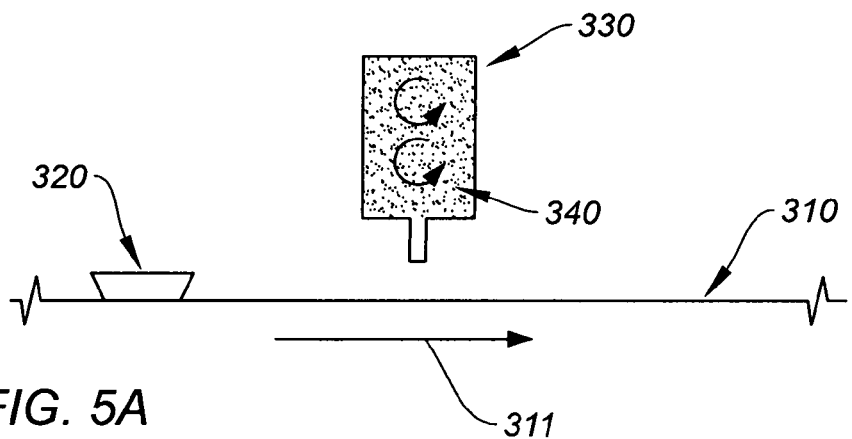
FIGS. 5A-5D "concept" sketch of the novel automatic manufacturing technique preferably used to fabricate gypsum or Portland cement components used in the invention.

In FIG. 5A, an automatic conveyor 310 moves in the direction shown by arrow 311. An empty plastic mold tray 320 is being conveyed toward an overhead automatic mixing and dispensing machine 330. Machine 330 automatically mixes a large quantity of gypsum or Portland cement with water to form a pourable slurry 340. In practice, conveyor 310 carries a series of trays 320; only one tray is shown in FIGS. 5A-5D for clarity.

Figure 5B:
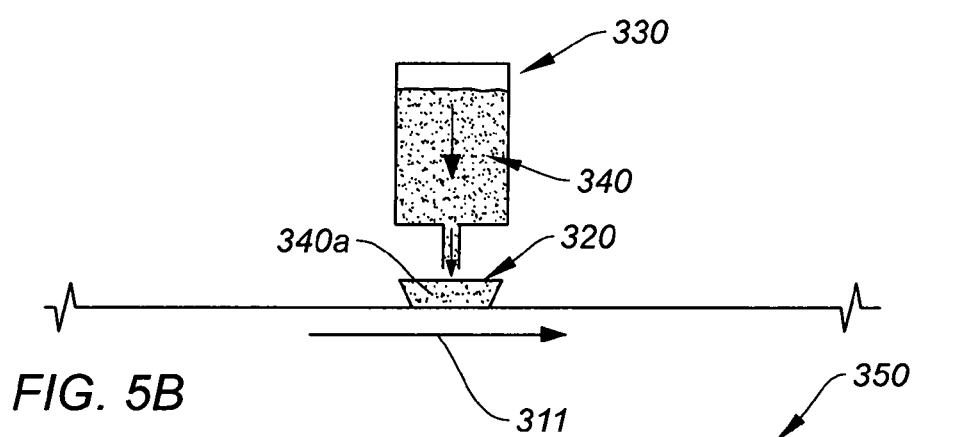

In FIG. 5B, the automatic mixer/dispenser 330 dispenses a precise, predetermined amount of slurry 340*a* into tray 320. Conveyor 310 preferably moves in an indexing, or stepwise fashion.

Figure 5C:
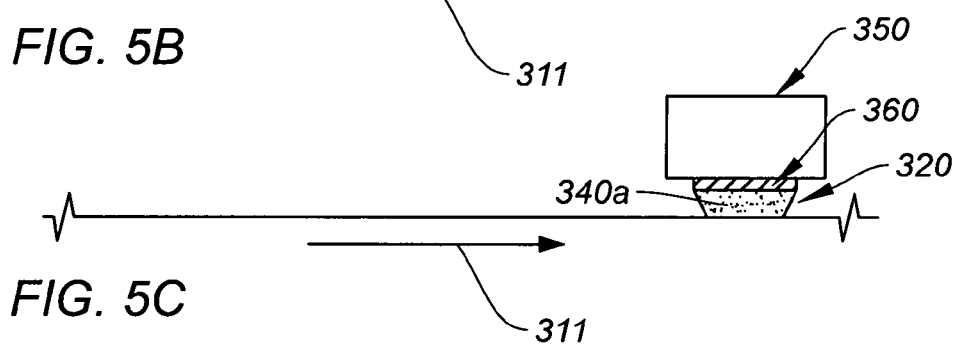

In FIG. 5C, tray 320 has been advanced to a position beneath an automatic, overhead sealing machine 350 which applies a thin plastic seal 360 to the top of tray 320.

Figure 5D:
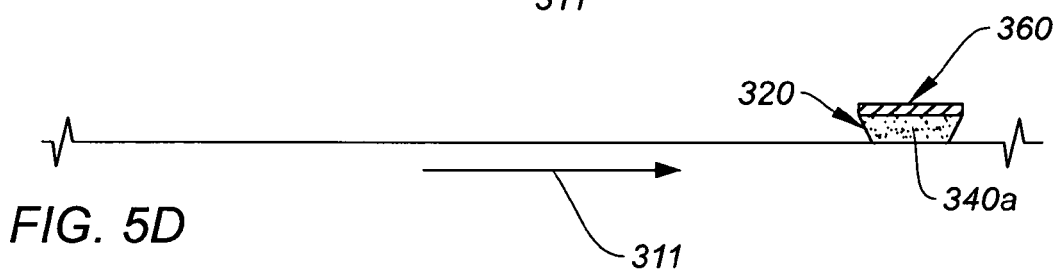

FIG. 5D shows the sealed tray 320 filled with a fully hydrated gypsum or Portland cement slurry 340*a*. The seal 360 maintains the hydration of slurry 340*a* until the slurry hardens and is ready to be placed in an external housing such as 20 or 220 shown above.

It is known in the prior art that disaster resistant data storage devices can use fire resistant exterior surfaces based on the dehydration of gypsum or Portland cement. If the exterior housing is fully hydrated gypsum or Portland cement, in the presence of fire the water in the gypsum or Portland cement starts to vaporize. As the water vaporizes, it absorbs the latent heat of vaporization which significantly helps to minimize the internal temperature of the disaster resistant housing. It is therefore desirable to fully hydrate the gypsum or Portland cement in the manufacturing process, and to maintain a maximum level of hydration. During the prior art production of insulation components for disaster resistant data storage devices, it is common to mix liquid water with a hydrated gypsum or Portland cement, which forms a temporary, pourable and liquid form. In it's temporary form, the mixture is hand poured into various shapes that both hold the data storage device as well as form the ventilation channels as described in the prior art.

Figure 6:
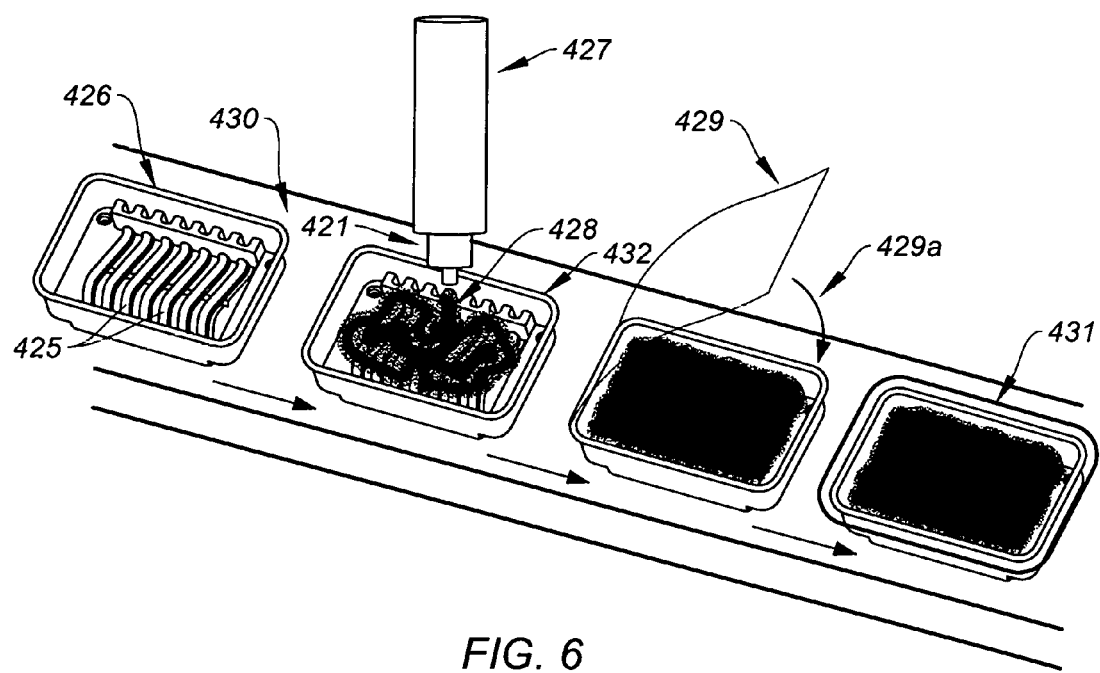
FIG. 6 is an illustration of the method shown in FIGS. 5A-5D

According to the present invention, as shown in FIG. 6, significant manufacturing improvements can be obtained by designing or using automated mixing equipment (427 in FIG. 6) in conjunction with an automated dispenser 421 of the exact amount of mixture 428. Insulation component trays 426 with the complex shapes and with the specialized vent openings shown in the prior art can be moved along a conveyor 430 and components can be formed up to 65% faster to save both time and money in the manufacturing of disaster resistant data storage devices. Tray 426 is a plastic mold having a complex, three dimensional shape 425 known in the art. After a short time, 15-30 minutes, the mixture cures to form a hardened solid shape typical with hydrated gypsum plaster forms for cement structures.

Because the insulation components may contain excess water as a by-product of the mixing process, the insulation components are poured into a thin plastic (0.020 thick) mold 432 that can be subsequently sealed with a thin membrane 429 (shown being applied as shown by arrow 429*a*)—not unlike molds and membrane seals used in the food industry to package one-time use containers for holding crackers, meat or cheese. Automating the sealing process can save an additional 10% of the time and money associated with this step of manufacturing disaster resistant data storage insulation components 431.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments suited to the particular use contemplated.

I claim:

1. Apparatus for protecting a vertically stacked array of operable computer digital data storage devices from damage or loss of data caused by fire, water, impact loads and/or crush loads, comprising;
   an operable array of vertically stacked digital data storage devices,
   a fire resistant external housing for said operable array, and
   a thermally conductive, water resistant enclosure for said operable array, wherein said enclosure is mounted inside said external housing and has side walls and a plurality of plates extending between said side walls to form separate cavities in which said individual computer data storage devices are carried, whereby said plates increase the transfer of heat away from said array of digital data storage devices and also increase the impact and crush load resistance of said water resistant enclosure,
   wherein said adjacent stacked data storage devices have vertical spaces between them and said plates are sufficiently thick to occupy at least 75% of said vertical spaces.

2. The apparatus of claim 1 further comprising bracing means mounted between said water resistant enclosure and said external housing to increase the impact and crush load resistance of said external housing.

3. The apparatus of claim 1 wherein said water resistant enclosure is formed with extruded metal.

4. The apparatus of claim 1 wherein each of said data storage devices is a hard drive.

* * * * *